(12) United States Patent
Huang et al.

(10) Patent No.: US 11,037,995 B2
(45) Date of Patent: Jun. 15, 2021

(54) ORGANIC LIGHT-EMITTING DISPLAY PANEL AND DISPLAY APPARATUS

(71) Applicant: WuHan TianMa Micro-Electronics Co., Ltd., Wuhan (CN)

(72) Inventors: Dan Huang, Wuhan (CN); Linshan Guo, Wuhan (CN)

(73) Assignee: WuHan TianMa Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/423,136

(22) Filed: May 27, 2019

(65) Prior Publication Data

US 2019/0280054 A1    Sep. 12, 2019

(30) Foreign Application Priority Data

Jan. 31, 2019    (CN) .......................... 201910099404.3

(51) Int. Cl.
*G09G 5/00* (2006.01)
*H01L 27/32* (2006.01)
(Continued)

(52) U.S. Cl.
CPC .......... *H01L 27/323* (2013.01); *G06F 1/1637* (2013.01); *G06F 3/044* (2013.01);
(Continued)

(58) Field of Classification Search
CPC .... G06F 1/1637; G06F 1/1626; G06F 1/1601; G06F 3/044; G06F 3/0412;
(Continued)

(56) References Cited

U.S. PATENT DOCUMENTS

2014/0063719 A1   3/2014   Yamazaki et al.
2014/0124785 A1*  5/2014   Tada ................... H01L 27/1266
                                                          257/59
(Continued)

FOREIGN PATENT DOCUMENTS

CN    107656646 A    2/2018
CN    107807468 A    3/2018
(Continued)

OTHER PUBLICATIONS

Office Action of Chinese Patent Application No. 201910099404.3 dated Jun. 28, 2020.

*Primary Examiner* — Jennifer T Nguyen
(74) *Attorney, Agent, or Firm* — Kilpatrick Townsend & Stockton, LLP

(57) ABSTRACT

The present disclosure provides an organic light-emitting display panel and a display apparatus for improving the touch performance. The display panel includes a driving device film layer, a light-emitting device film layer, an encapsulation film layer and a touch film layer. The touch film layer includes a first touch metal layer, a touch insulation layer and a second touch metal layer that are sequentially stacked. The display panel has a display area and a non-display area. The non-display area includes a touch bonding region and a display bonding region that are located on two opposite sides of the display area. A touch connection pin is provided in the touch bonding region and located in the first touch metal layer or the second touch metal layer, and a display connection pin is provided in the display bonding region and located in the driving device film layer.

19 Claims, 17 Drawing Sheets

(51) Int. Cl.
*H01L 51/50* (2006.01)
*H01L 51/52* (2006.01)
*G06F 3/044* (2006.01)
*G06F 1/16* (2006.01)

(52) U.S. Cl.
CPC ........ *G06F 3/0443* (2019.05); *H01L 51/5012* (2013.01); *H01L 51/5237* (2013.01)

(58) Field of Classification Search
CPC .......... G06F 2203/04102; H05K 1/147; H01L 27/323; H01L 51/0097
USPC .................................................... 345/76, 174
See application file for complete search history.

(56) References Cited

U.S. PATENT DOCUMENTS

| | | | | |
|---|---|---|---|---|
| 2018/0173346 | A1* | 6/2018 | Du | ............................ G06F 3/044 |
| 2019/0113948 | A1* | 4/2019 | Yamazaki | ............. G06F 1/1626 |
| 2019/0267434 | A1* | 8/2019 | Liu | ........................ G06F 1/1684 |

FOREIGN PATENT DOCUMENTS

| | | | |
|---|---|---|---|
| CN | 108416280 A | 8/2018 | |
| CN | 108598287 A | 9/2018 | |

\* cited by examiner

ORGANIC LIGHT-EMITTING DISPLAY PANEL AND DISPLAY APPARATUS

CROSS-REFERENCE TO RELATED APPLICATIONS

The present application claims priority to Chinese Patent Application No. 201910099404.3, filed on Jan. 31, 2019, the content of which is incorporated herein by reference in its entirety.

FIELD

The present disclosure relates to display technology, and more particularly, to an organic light-emitting display panel, and a display apparatus.

BACKGROUND

With the development of display technology, an Organic Light-emitting Display (OLED) panel is increasingly widely used due to its excellent properties such as self-luminescence, high brightness, wide viewing angle and rapid response.

The existing organic light-emitting display panel includes a display film layer and a touch film layer that are separate. However, a touch performance may be adversely affected due to the manufacturing process of the touch film layer and the like.

SUMMARY

The present disclosure provides an organic light-emitting display panel and a display apparatus, aiming to improve the touch performance.

One embodiment of the present disclosure provides an organic light-emitting display panel. The organic light-emitting display panel includes: a driving device film layer; a light-emitting device film layer; an encapsulation film layer; and a touch film layer. The driving device film layer, the light-emitting device film layer, the encapsulation film layer and the touch film layer are sequentially stacked. The touch film layer includes a first touch metal layer, a touch insulation layer and a second touch metal layer that are sequentially stacked. The first touch metal layer is located between the second touch metal layer and the encapsulation film layer. The organic light-emitting display panel has a display area and a non-display area, the non-display area includes a touch bonding region and a display bonding region, and the touch bonding region and the display bonding region are located on two opposite sides of the display area, respectively. A touch connection pin is provided in the touch bonding region, and the touch connection pin is located in the first touch metal layer or the second touch metal layer. A display connection pin is provided in the display bonding region, and the display connection pin is located in the driving device film layer.

One embodiment of the present disclosure provides a display apparatus including the organic light-emitting display panel according to one embodiment.

BRIEF DESCRIPTION OF DRAWINGS

Embodiments of the present disclosure are described in the accompanying drawings used in the embodiments and in the related art are briefly described below. The drawings described below are merely a part of the embodiments of the present disclosure.

DESCRIPTION OF EMBODIMENTS

Embodiments of the present disclosure are described in details with reference to the drawings. Embodiments described are merely part of the embodiments of the present disclosure rather than all of the embodiments.

The terms used in the embodiments of the present disclosure are merely for the purpose of describing embodiments, rather than limiting the present disclosure. The singular form "a", "an", "the" and "said" used in the embodiments and claims shall be interpreted as also including the plural form, unless indicated otherwise in the context.

Figure 1:
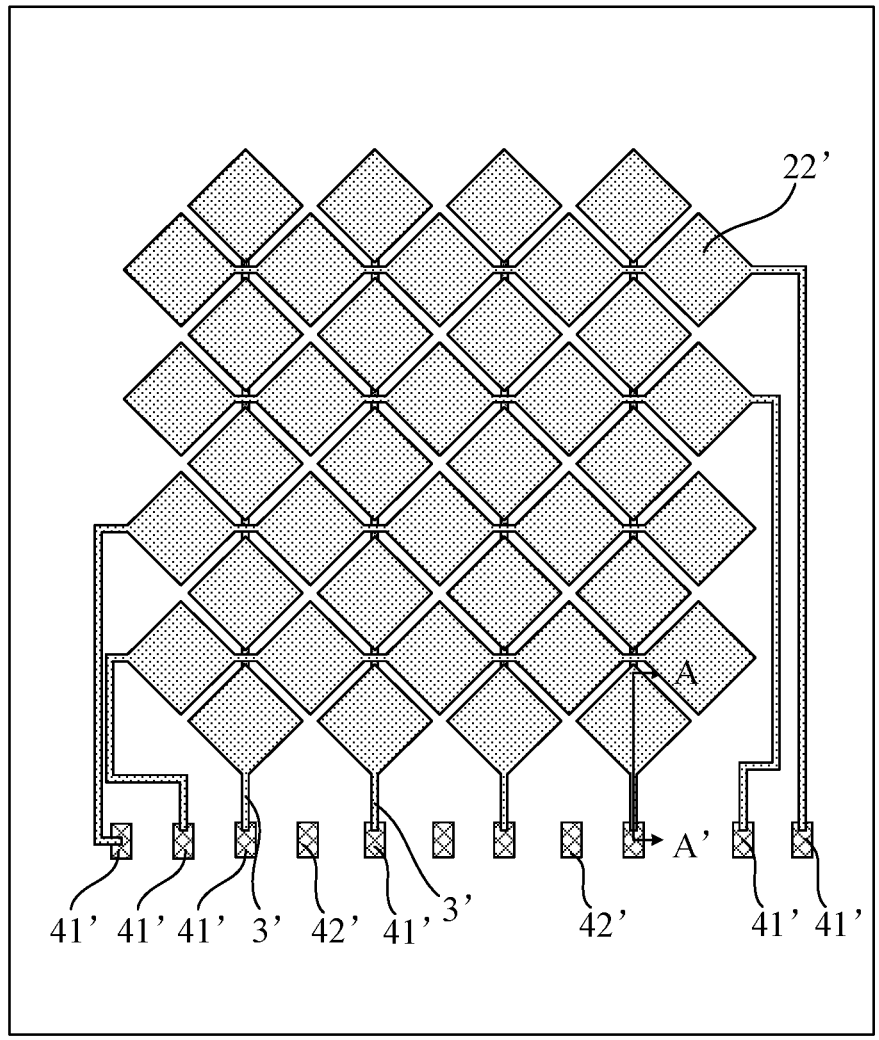
FIG. 1 is a structural schematic diagram of an organic light-emitting display panel provided in the related art.
Figure 2:
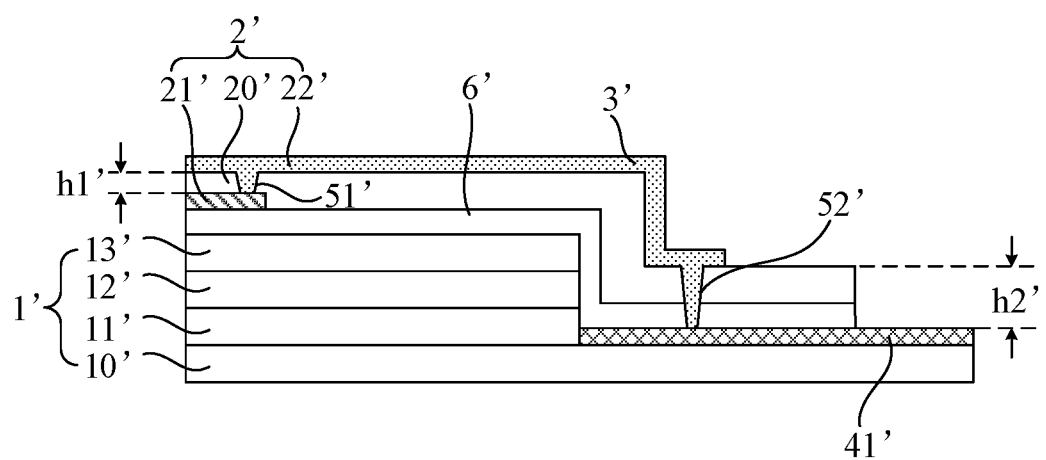
FIG. 2 is a cross-sectional view along AA' direction shown in FIG. 1.

In order to further illustrate the beneficial effects of the embodiments of the present disclosure, before describing the embodiments of the present disclosure in detail, the problems of the related art found by the inventor will be firstly discussed. FIG. 1 is a structural schematic diagram of an organic light-emitting display panel in the related art, and FIG. 2 is a cross-sectional view along AA' direction of FIG. 1. As shown in FIG. 1 and FIG. 2, the organic light-emitting display panel includes a display film layer 1' and a touch film layer 2'. The touch film layer 2' includes a first touch metal layer 21', a touch insulation layer 20', and a second touch metal layer 22' that are stacked. The second touch metal layer 22' forms a touch electrode, and the touch electrode is electrically connected to a touch connection pin 41' via a touch control signal line 3' that is also formed by the second touch metal layer 22'. The touch connection pin 41', which is exposed on a surface of the OLED display panel once it has been manufactured, is used to be electrically connected to a flexible circuit board by bonding, which is in turn electrically connected to a driving chip, or the touch connecting pin 41' is used to be directly connected to the driving chip by bonding. This can achieve an electrical connection between the driving chip and the touch electrode, and thus a display function can be achieved. The organic light-emitting display panel further includes a display connection pin 42'. The display connection pin 42' is manufactured in the same layer as a film layer included in the display film layer 1', and is electrically connected to the circuit in the display film layer 1'. The display connection pin 42', which is exposed on the surface of the organic light-emitting display panel once it has been manufactured, is used to be bound to the flexible circuit board by bonding, which is in turn bound and connected to the driving chip, or the display connection pin 42' is used to be directly bound and connected to the driving chip by bonding. This can achieve bonding and connection between the driving chip and the circuit in the display film layer 1', and thus a display function can be achieved. The touch connection pin 41' and the display connection pin 42' are located on the same side of the organic light-emitting display panel and arranged in the same layer, and they are bonded and connected to the driving chip in one bonding process. In the touch film layer 2', the first touch metal layer 21' is formed as a bridge, and a touch electrode block formed by the second touch metal layer 22' is electrically connected to the bridge in the first touch metal layer 21' via a first through-hole 51'. The touch connection pin 41' is disposed in the same layer as a layer in the display film layer 1', and a touch buffering layer 6' is provided between the display film layer 1' and the touch film layer 2'. The display film layer 1' includes a display buffering layer 10', a driving device layer 11', a light-emitting device layer 12' and an encapsulation layer 13'. The touch insulation layer 20' is disposed between the second touch metal layer 22' and the first touch metal layer 21'. In this way, the touch signal line 3' formed by the second touch metal layer 22' is electrically connected to the touch connection pin 41' via a second through-hole 52' in the touch buffering layer 6' and the touch insulation layer 20'. The first through-hole 51' has a depth h1', and the through-hole 52' has a depth h2', where h1'<h2'. Although the first through-hole 51' and the second through-hole 52' have different depths, they are formed in a same patterning process. In this regard, the first touch metal layer 21' is likely to be excessively etched at the first through-hole 51', thereby leading to a poor contact between the first touch metal layer 21' and the second touch metal layer 22'. Therefore, the touch property will be adversely affected.

Figure 3:
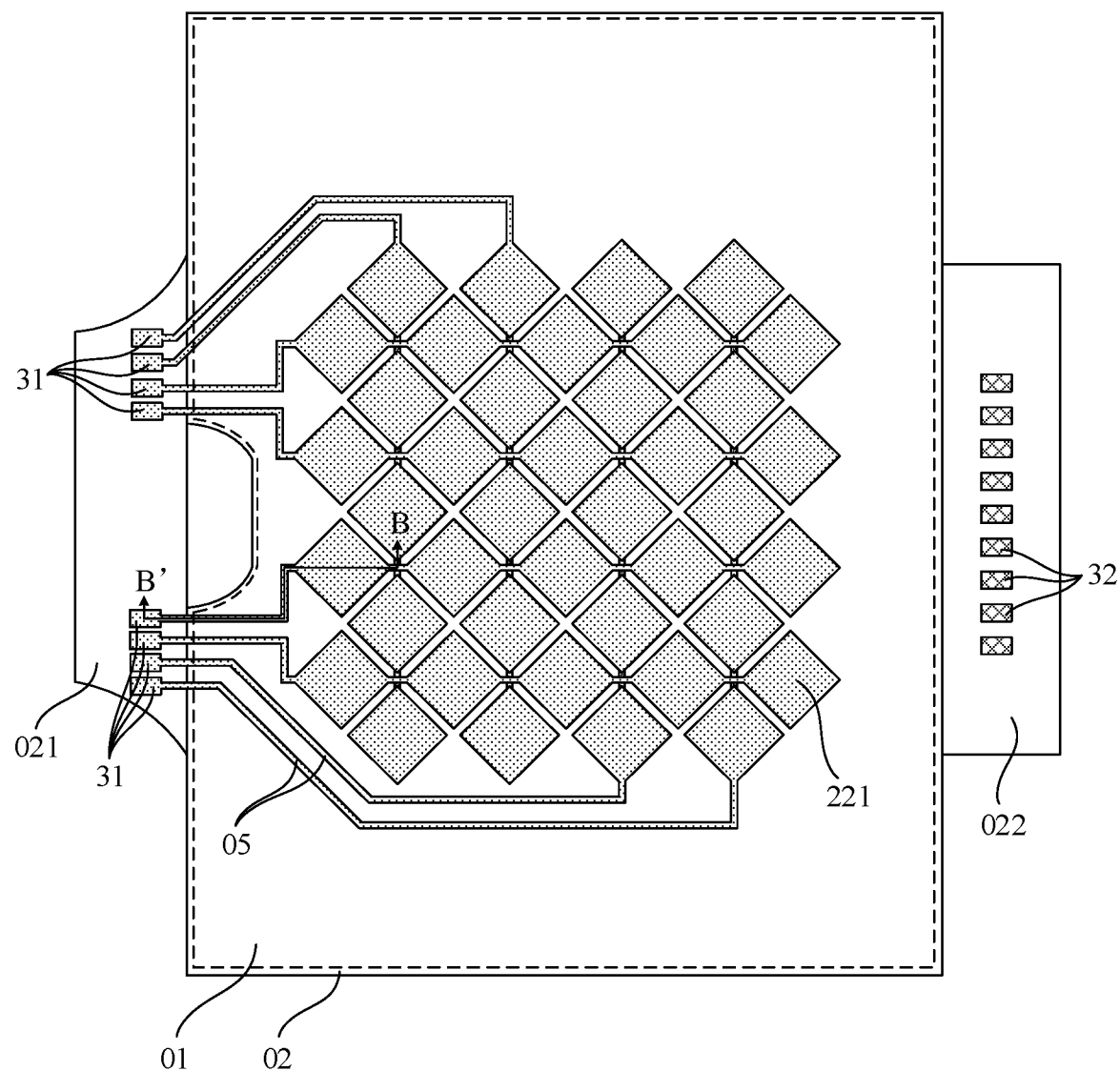
FIG. 3 is a structural schematic diagram of an organic light-emitting display panel according to an embodiment of the present disclosure in an unfolded state.
Figure 4:
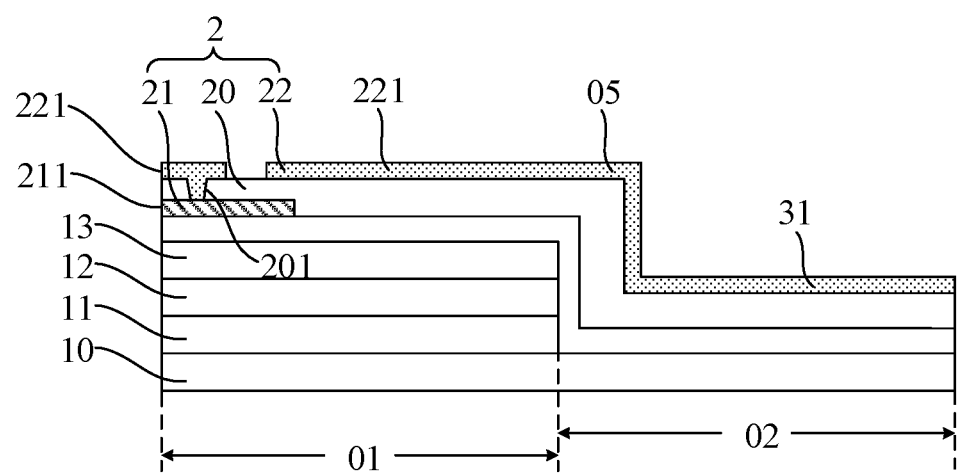
FIG. 4 is a cross-sectional view of the organic light-emitting display panel shown in FIG. 3 along BB'.

FIG. 3 is a structural schematic diagram of an organic light-emitting display panel according to an embodiment of the present disclosure in an unfolded state, and FIG. 4 is a cross-sectional view of the organic light-emitting display panel shown in FIG. 3 along BB' direction. As shown in FIG. 3 and FIG. 4, an organic light-emitting display panel provided by an embodiment of the present disclosure includes a display buffering layer 10, a driving device film layer 11, a light-emitting device film layer 12, an encapsulation film layer 13, and a touch film layer 2 that are sequentially stacked. The touch film layer 2 includes a first touch metal layer 21, a touch insulation layer 20, and a second touch metal layer 22 that are sequentially stacked. The first touch metal layer 21 is disposed between the second touch metal layer 22 and the encapsulation film layer 13. The organic light-emitting display panel has a display area 01 and a non-display area 02. The non-display area 02 includes a touch bonding region 021 and a display bonding region 022. The touch bonding region 021 and the display bonding region 022 are located on two opposite sides of the display area 01, respectively. A touch connection pin 31 is provided in the touch bonding region 021, and the touch connection pin 31 is located in the first touch metal layer 21 or the second touch metal layer 22. A display connection pin 32 is provided in the display bonding region 022, and the display connection pin 32 is located in the driving device film layer 11.

The driving device film layer 11 includes a device for driving the organic light-emitting display panel to display an image, such as a pixel driving circuit and a scan driving circuit. The light-emitting device film layer 12 includes a light-emitting device for emitting light. In one embodiment, the light-emitting device includes an anode, a cathode, and an organic light-emitting layer. When a voltage is applied to the anode and the cathode, holes and electrons are injected into the organic light-emitting layer and recombined therein, thereby releasing energy and emitting light. One of the first touch metal layer 21 and the second touch metal layer 22 is used to form a touch electrode, and the other one thereof is used to form a bridge. The bridge is used in an electrical connection between touch electrode blocks in the touch electrode. In one embodiment, in the structure shown in FIG. 3 and FIG. 4, the second touch metal layer 22 is used to form the touch electrode, and the first touch metal layer 21 is used to form the bridge. The touch connection pin 31 in the touch bonding region 021 is configured to be bound to a flexible circuit board and further electrically connected to a driving chip, or configured to be directly bound to the driving chip. Similarly, the display connection pin 32 in the display bonding region 022 is configured to be bound to a flexible circuit board and further be electrically connected to a driving chip, or configured to be directly bound to the driving chip. The touch connection pin 31 and the display connection pin 32 can be either electrically connected to a same driving chip, or electrically connected to different driving chips. A protective layer can be provided on the second touch metal layer 22. The protective layer can be made of an inorganic material such as silicon nitride, silicon oxide or the like, which prevents the touch metal layer from being corroded by water in the air. The protective layer can also be made of an organic material, in order to meet requirement on bending of flexible display apparatus.

In the organic light-emitting display panel according to the embodiment of the present disclosure, as the touch bonding region and the display bonding region are respectively located on two opposite sides of the display area, the touch bonding region and the display bonding region, when being bound, can be respectively bonded and connected to the flexible circuit board or the driving chip in two different bonding processes. In this way, the touch connection pin and the display connection pin can be fabricated with different metal layers, i.e., the display connection pin is located in the driving device film layer and the touch connection pin is located in the first touch metal layer or the second touch metal layer. This can avoid the problems in the related art, in which the touch electrode is connected to the driving device film layer and the bridge via through-holes having different depths, thereby alleviating the excessive etching caused by the through-holes having different depths above the touch metal layer and thus improving the touch performance.

Figure 5:
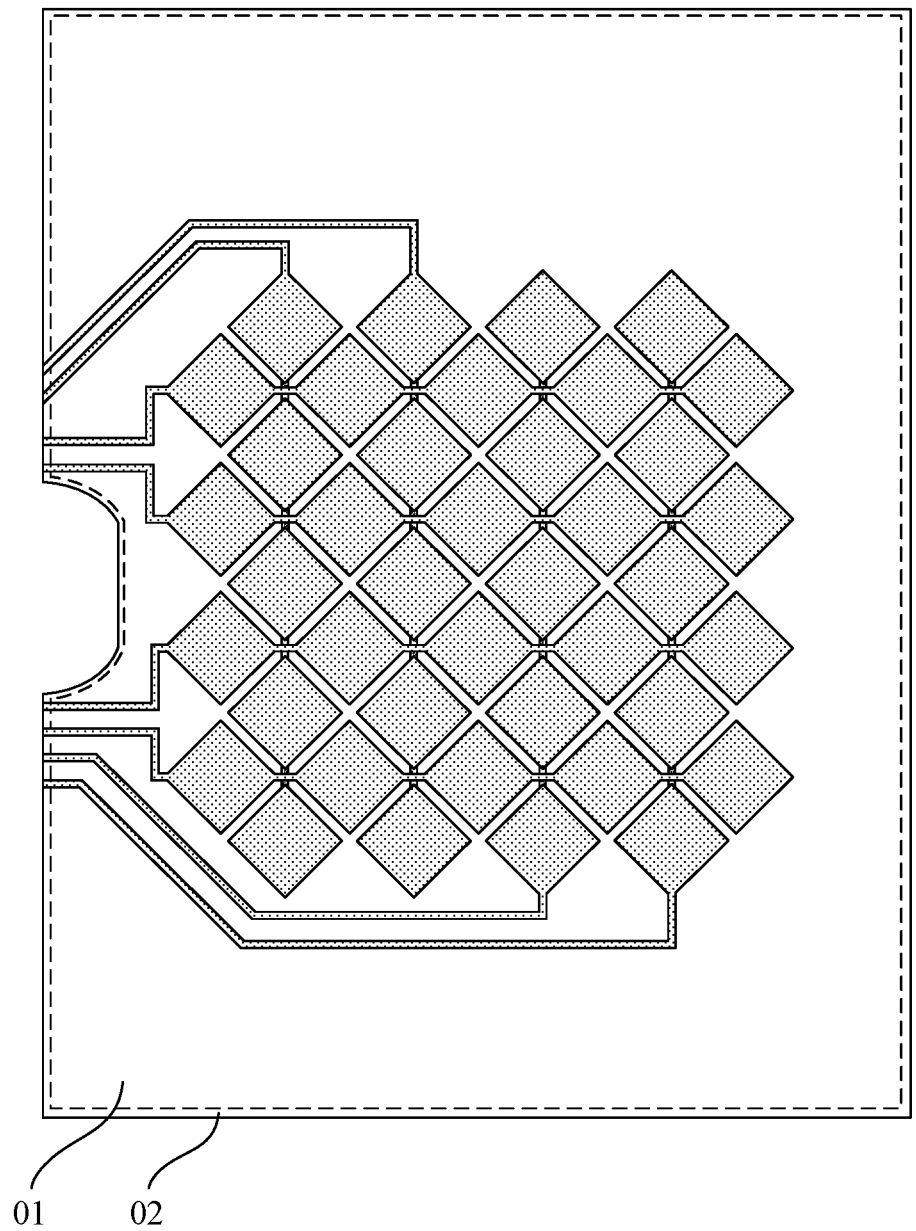
FIG. 5 is a structural schematic diagram of the organic light-emitting display panel shown in FIG. 3 in a bent state.
Figure 6:
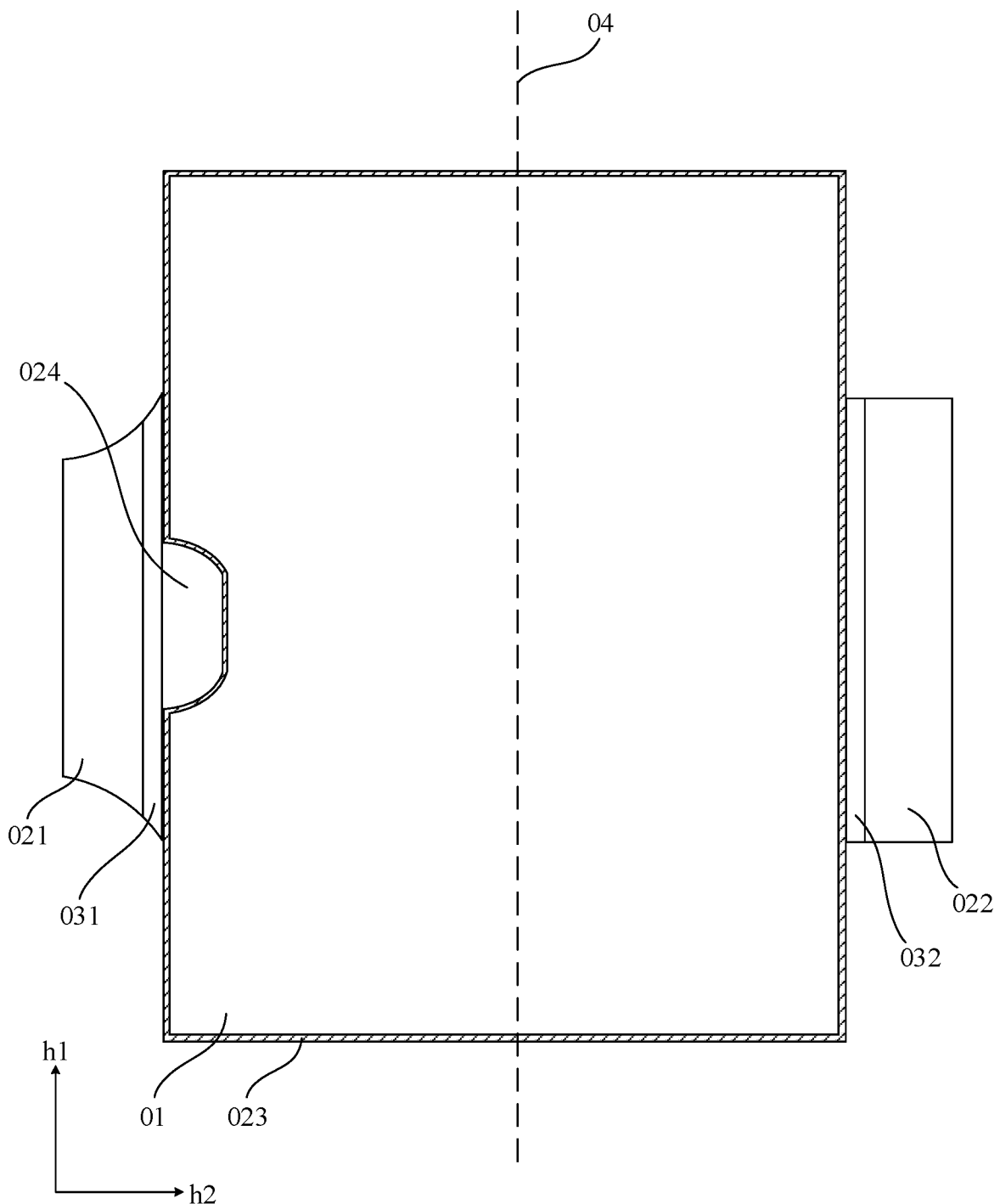
FIG. 6 is a structural schematic diagram of respective regions of the organic light-emitting display panel shown in FIG. 3.

FIG. 5 is a structural schematic diagram of the organic light-emitting display panel shown in FIG. 3 in a bent state, and FIG. 6 is a structural schematic diagram of respective regions of the organic light-emitting display panel shown in FIG. 3. As shown in FIGS. 3 to 6, the non-display area 02 includes a frame region 023 surrounding the display area 01. The touch bonding region 021 and the display bonding region 022 are located on two opposite sides of the frame region 023, respectively. A stripe-shaped first bending region 031 is provided between the touch bonding region 021 and the frame region 023, so that a portion of the organic light-emitting display panel located in the touch bonding region 021 is bendable to a back surface of the organic light-emitting display panel along an extending direction of the first bending region 031. A stripe-shaped second bending region 032 is provided between the display bonding region 022 and the frame region 023, so that a portion of the organic light-emitting display panel located in the display bonding region 022 is bendable to the back surface of the organic light-emitting display panel along an extending direction of the second bending region 032.

In the bent state, the touch connection pin 31 and the display connection pin 32 are both bent to the back surface of the organic light-emitting display panel, which is more conducive to achieving a narrow frame. On the one hand, the pin bonding can be achieved on the back surface of the organic light-emitting display panel, and on the other hand, it is also possible to arrange a lead line or a peripheral circuit on the back surface of the organic light-emitting display panel.

As shown in FIGS. 3 to 6, the frame region 023 includes a light-transmitting sub-region 024 and a light-proof sub-region (the sub-region filled with oblique lines in FIG. 6 is the light-proof sub-region). The light-transmitting sub-region 024 is located on a side of the display area 01 close to the first bending region 031.

The light-transmitting sub-region 024 can a physical through-hole on the organic light-emitting display panel, or a zone formed by at least a part of transparent film layers, as long as light can be transmitted. A front camera or other optical device is provided in the light-transmitting sub-region 024 to achieve a corresponding function.

As shown in FIGS. 3 to 6, the light-transmitting sub-region 024 is located between the first bending region 031 and the display area 01, an edge of the light-transmitting sub-region 024 facing away from the display area 01 coincides with an edge of the first bending region 031 close to the display area 01, and an edge of the light-transmitting sub-region 024 close to the display area 01 is spaced apart from the display area 01 by the light-proof sub-region.

When the light-transmitting sub-region 024 is located between the touch bonding region 021 and the display area 01, metal wirings such as data lines, which may not be provided in the light-transmitting sub-region 024, bypass the light-transmitting sub-region 024 to be provided in the touch bonding region 021, and are further bent to the back surface of the organic light-emitting display panel. Therefore, the space occupied by the metal wirings between the light-transmitting sub-region 024 and the display area 01 is reduced, so as to further increase a ratio of display area on a front surface of the organic light-emitting display panel.

As shown in FIGS. 3 to 6, the light-transmitting sub-region 024 is located between the first bending region 031 and the display area 01, and at least part of signal lines in the driving device film layer 11 is located in the touch bonding region 021. This can reduce the space occupied by the signal lines between the light-transmitting sub-region 024 and the display area 01, thereby further increasing the ratio of display area on the front surface of the organic light-emitting display panel.

Figure 7:
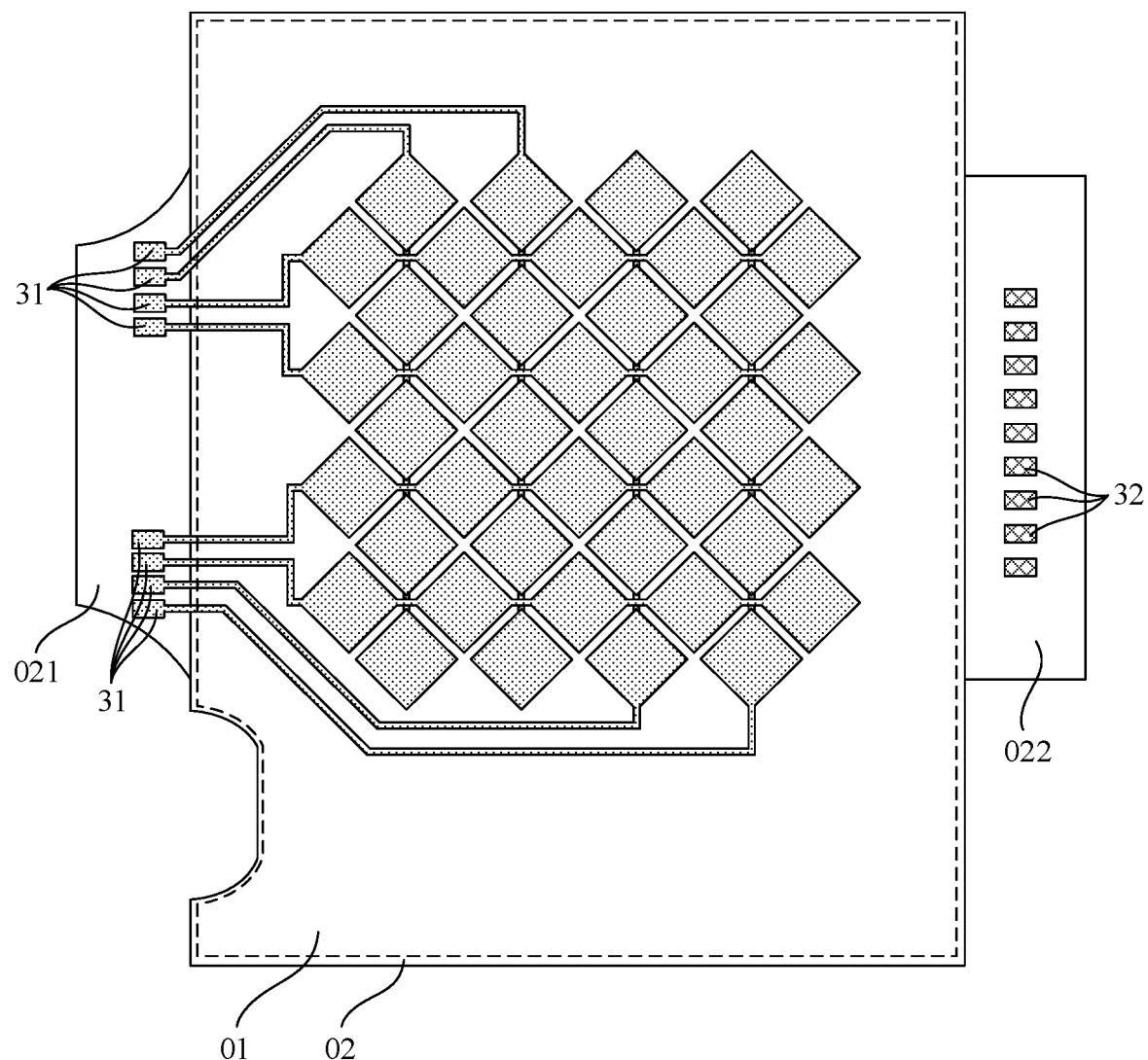
FIG. 7 is a structural schematic diagram of an organic light-emitting display panel according to another embodiment of the present disclosure in an unfolded state.
Figure 8:
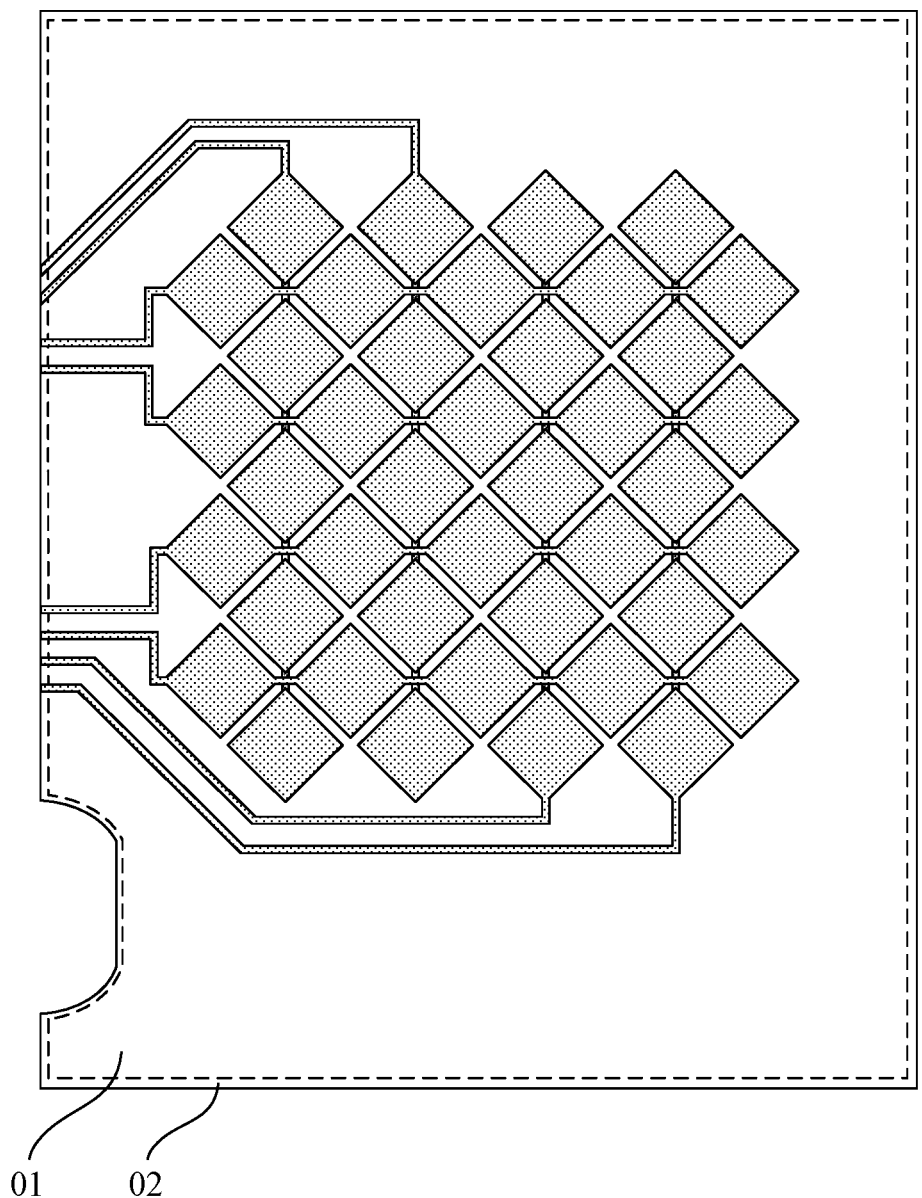
FIG. 8 is a structural schematic diagram of the organic light-emitting display panel shown in FIG. 7 in a bent state.
Figure 9:
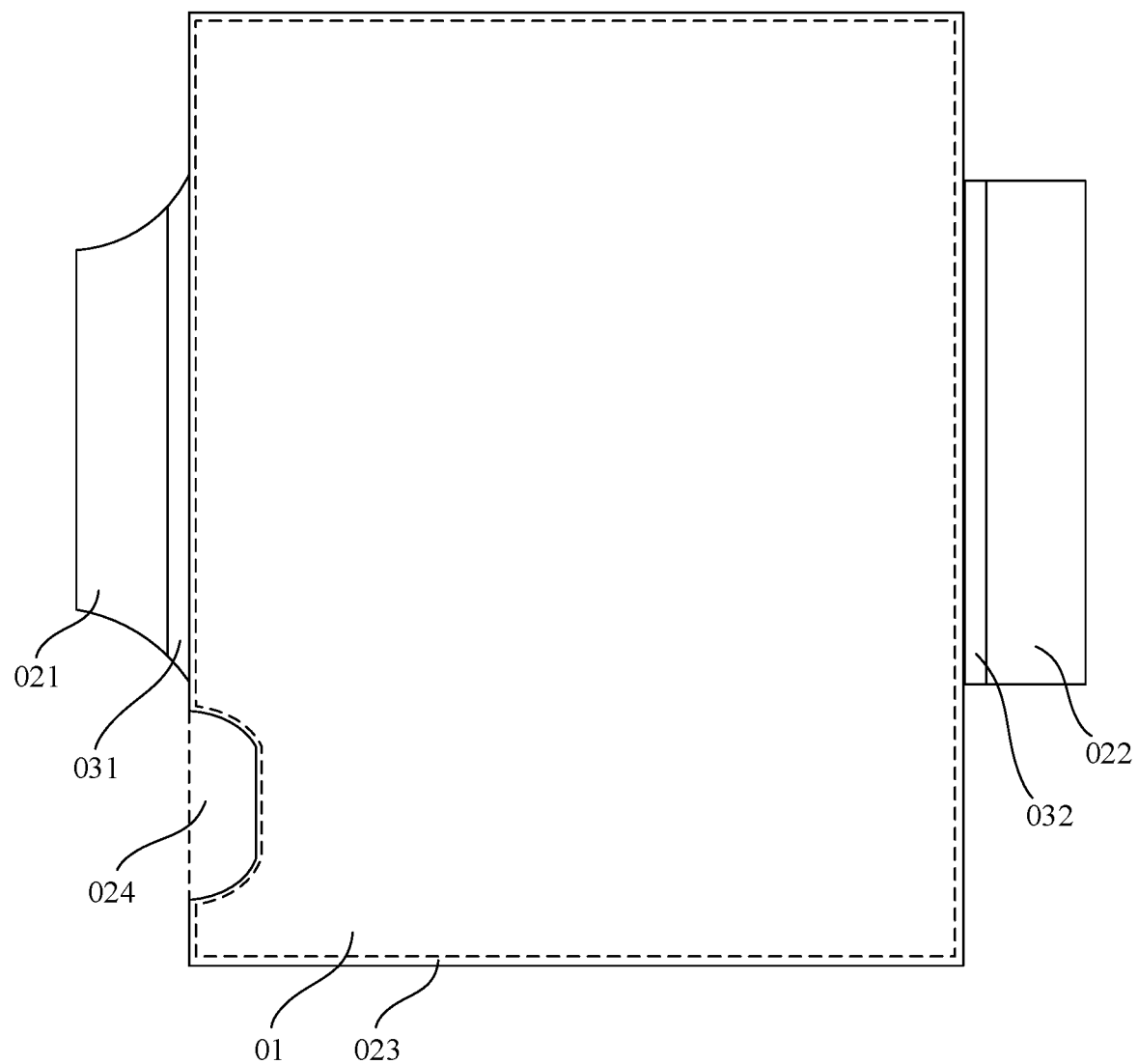
FIG. 9 is a structural schematic diagram of respective regions of the organic light-emitting display panel shown in FIG. 7.

FIG. 7 is a structural schematic diagram of an organic light-emitting display panel according to another embodiment of the present disclosure in an unfolded state, FIG. 8 is a structural schematic diagram of the organic light-emitting display panel shown in FIG. 7 in a bent state, and FIG. 9 is a structural schematic diagram of respective regions of the organic light-emitting display panel shown in FIG. 7. As shown in FIGS. 7 to 9, the light-transmitting sub-region 024 and the touch bonding region 021 are staggered in the extending direction of the first bending region 031. In one embodiment, the light-transmitting sub-region 024 can be located on a lower side or upper side of the touch bonding region 021.

Figure 10:
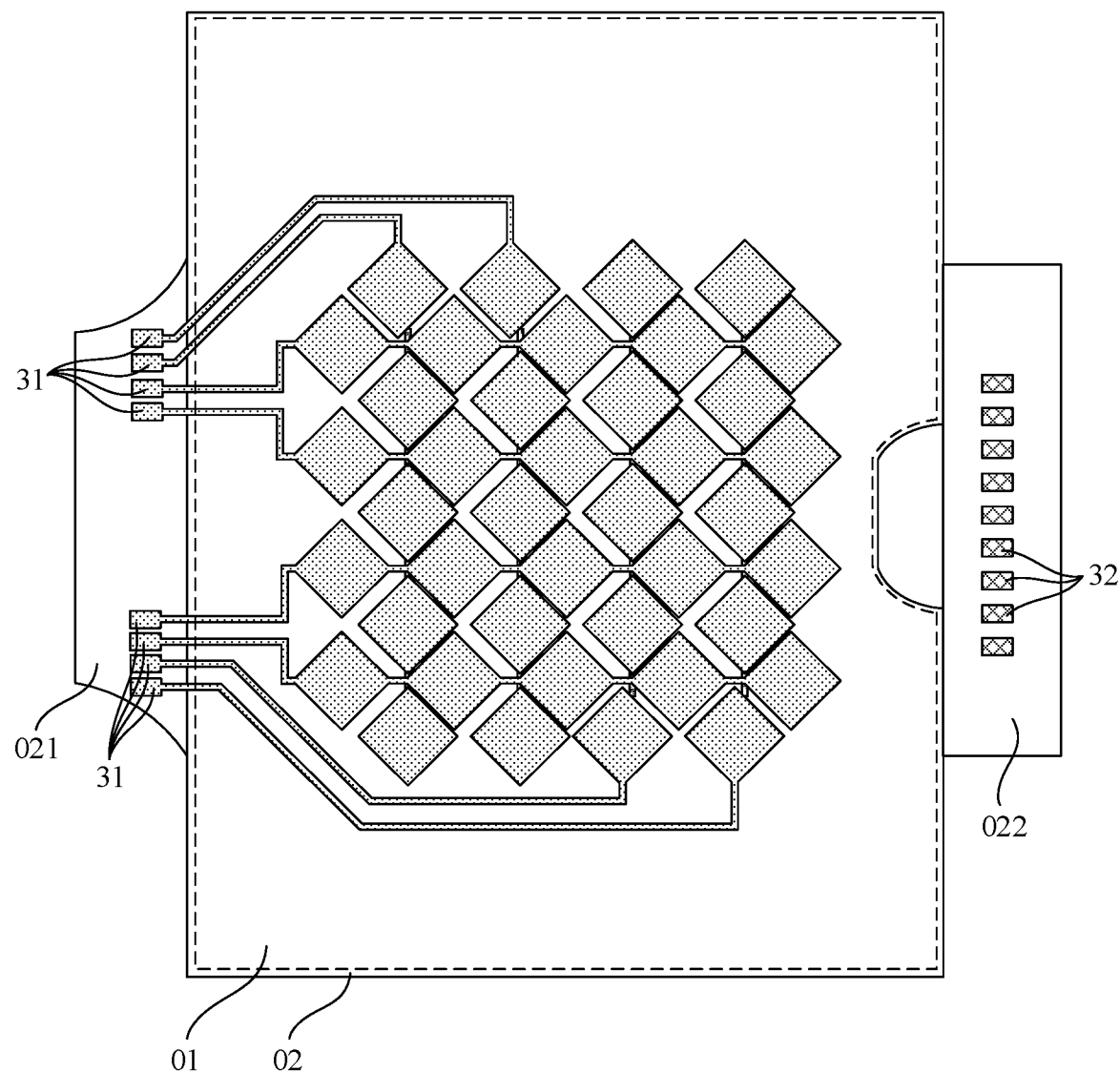
FIG. 10 is a structural schematic diagram of an organic light-emitting display panel according to yet another embodiment of the present disclosure in an unfolded state.
Figure 11:
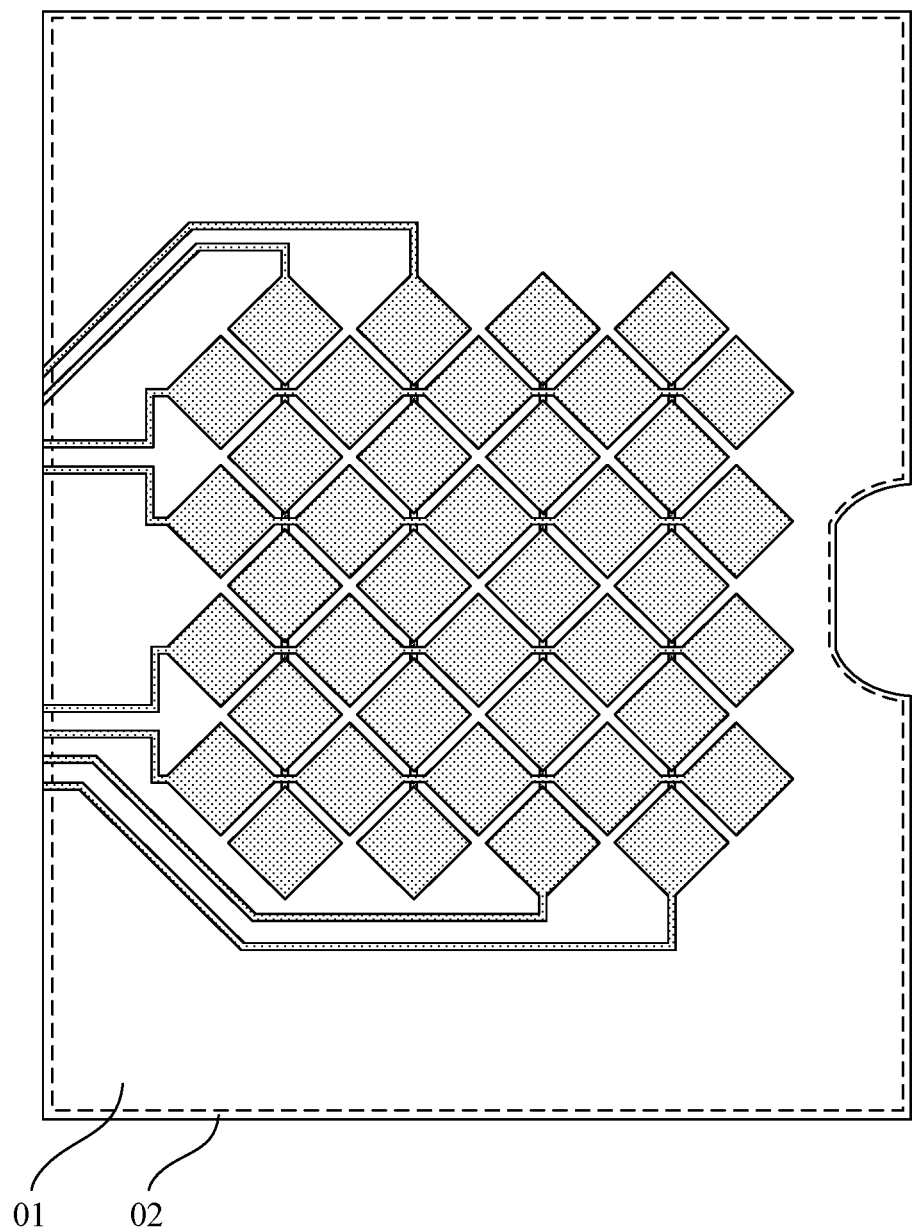
FIG. 11 is a structural schematic diagram of the organic light-emitting display panel shown in FIG. 10 in a bent state.
Figure 12:
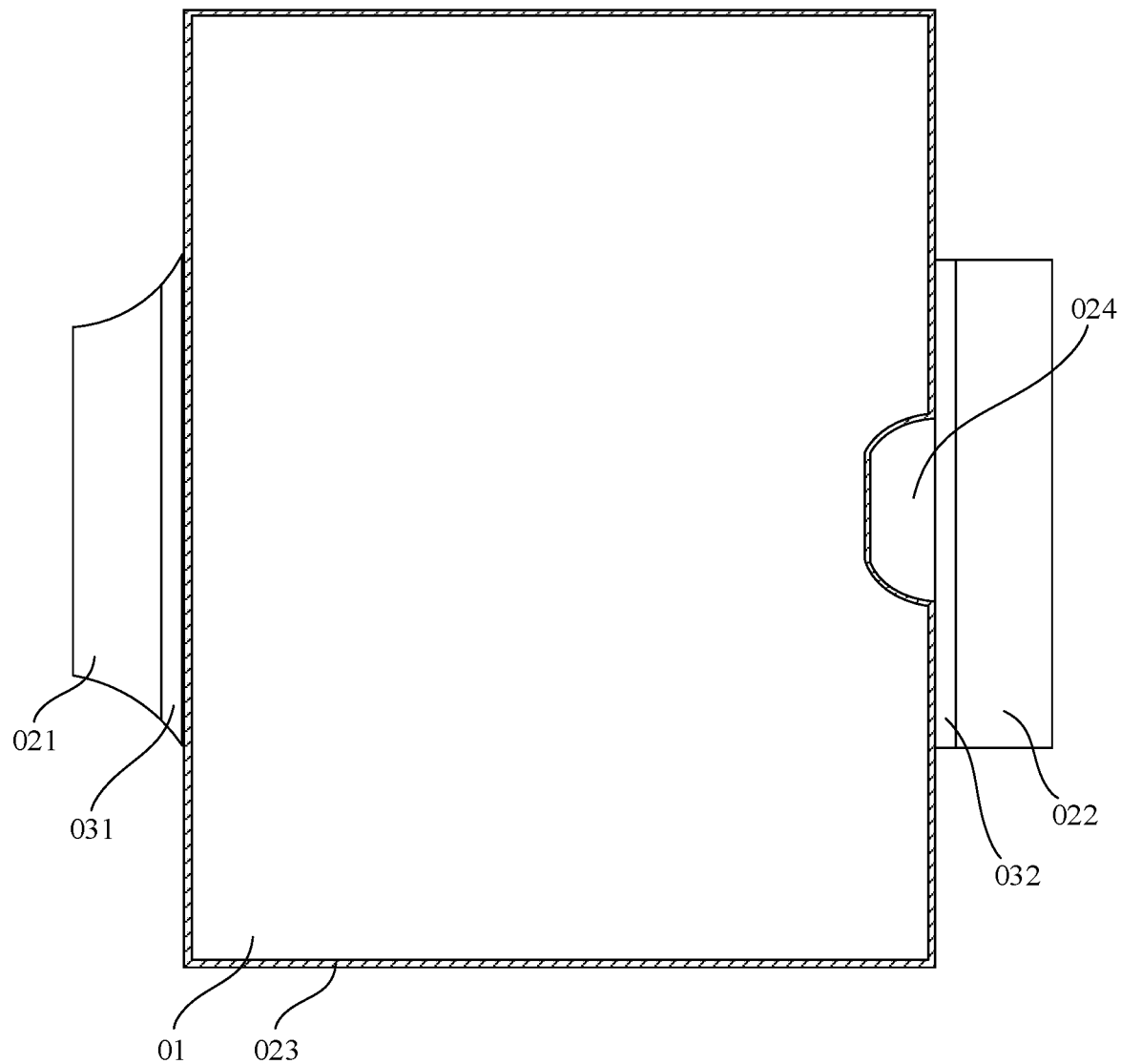
FIG. 12 is a structural schematic diagram of respective regions of the organic light-emitting display panel shown in FIG. 10.

FIG. 10 is a structural schematic diagram of an organic light-emitting display panel according to yet another embodiment of the present disclosure in an unfolded state, FIG. 11 is a structural schematic diagram of the organic light-emitting display panel shown in FIG. 10 in a bent state, and FIG. 12 is a structural schematic diagram of respective regions of the organic light-emitting display panel shown in FIG. 10. As shown in FIGS. 10 to 12, the frame region 023 includes a light-transmitting sub-region 024, and the light-transmitting sub-region 024 is located on a side of the display area 01 close to the second bending region 032.

As shown in FIGS. 10 to 12, the light-transmitting sub-region 024 is located between the second bending region 032 and the display area 01. An edge of the light-transmitting sub-region 024 facing away from the display area 01 coincides with an edge of the second bending region 032 close to the display area 01, and an edge of the light-transmitting sub-region 024 close to the display area 01 is spaced apart from the display area 01.

When the light-transmitting sub-region 024 is located between the display bonding region 022 and the display area 01, metal wirings such as data lines, which may not be provided in the light-transmitting sub-region 024, bypass the light-transmitting sub-region 024 to be provided in the display bonding region 022, and are further bent to the back surface of the organic light-emitting display panel. This can reduce the space occupied by the metal wirings between the light-transmitting sub-region 024 and the display area 01, thereby further increasing the ratio of display area on the front surface of the organic light-emitting display panel.

Figure 13:
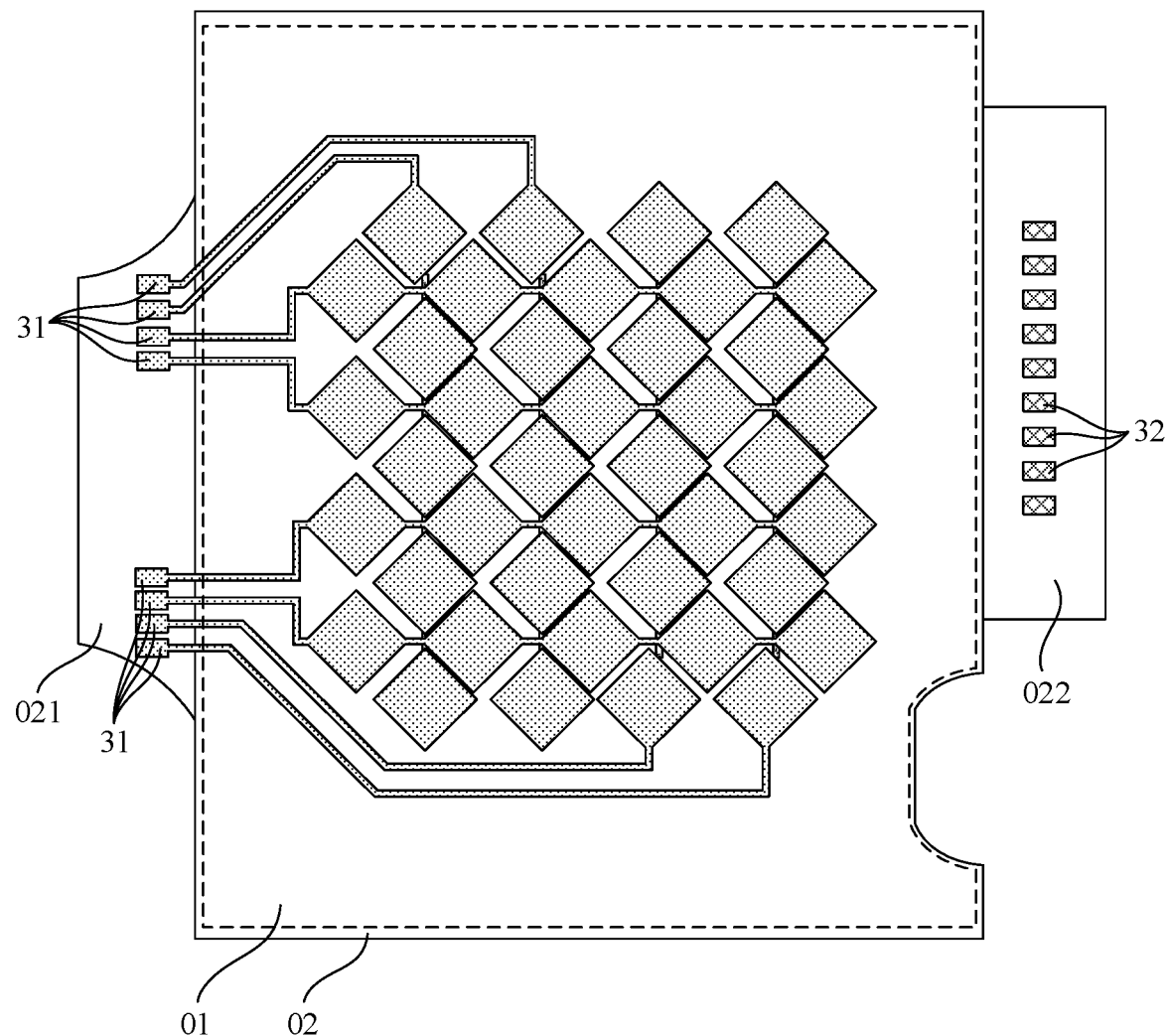
FIG. 13 is a structural schematic diagram of an organic light-emitting display panel according to yet another embodiment of the present disclosure in an unfolded state.
Figure 14:
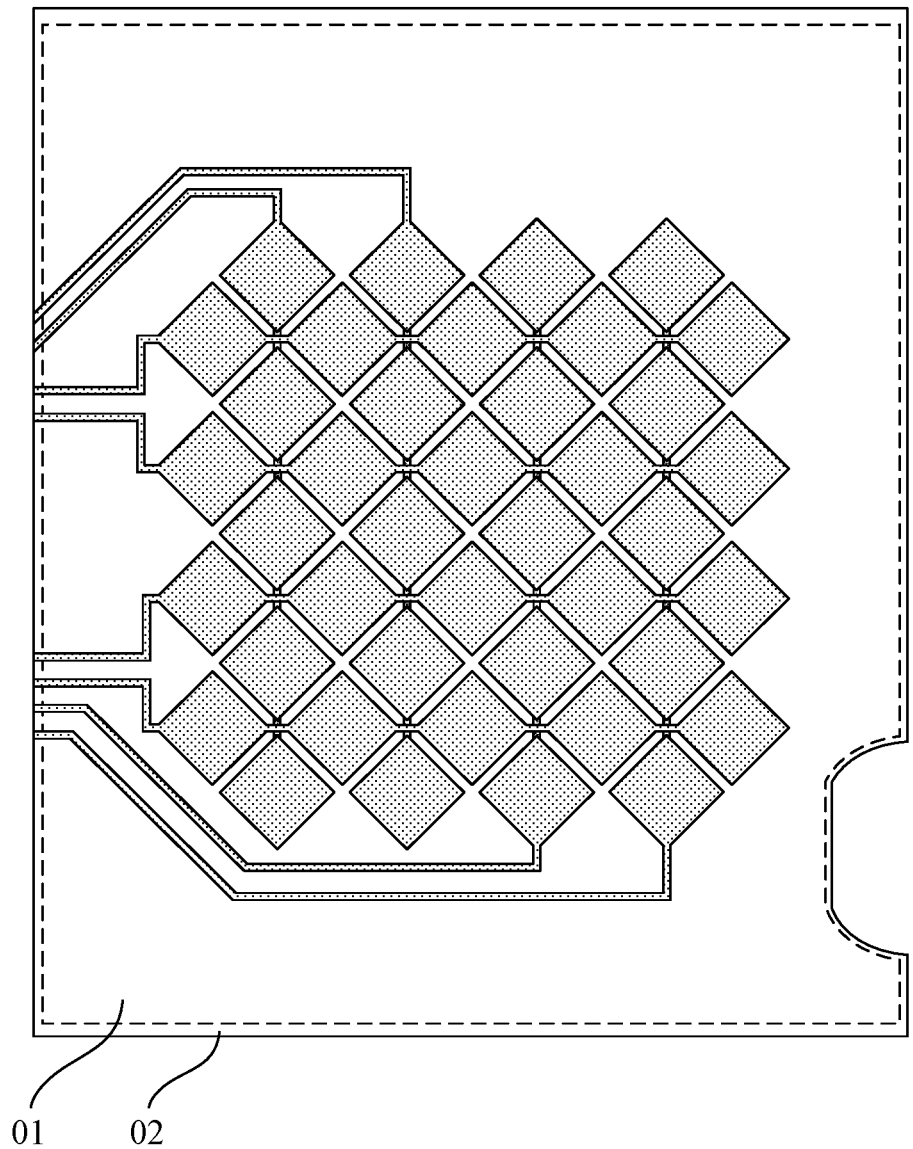
FIG. 14 is a structural schematic diagram of the organic light-emitting display panel shown in FIG. 13 in a bent state.
Figure 15:
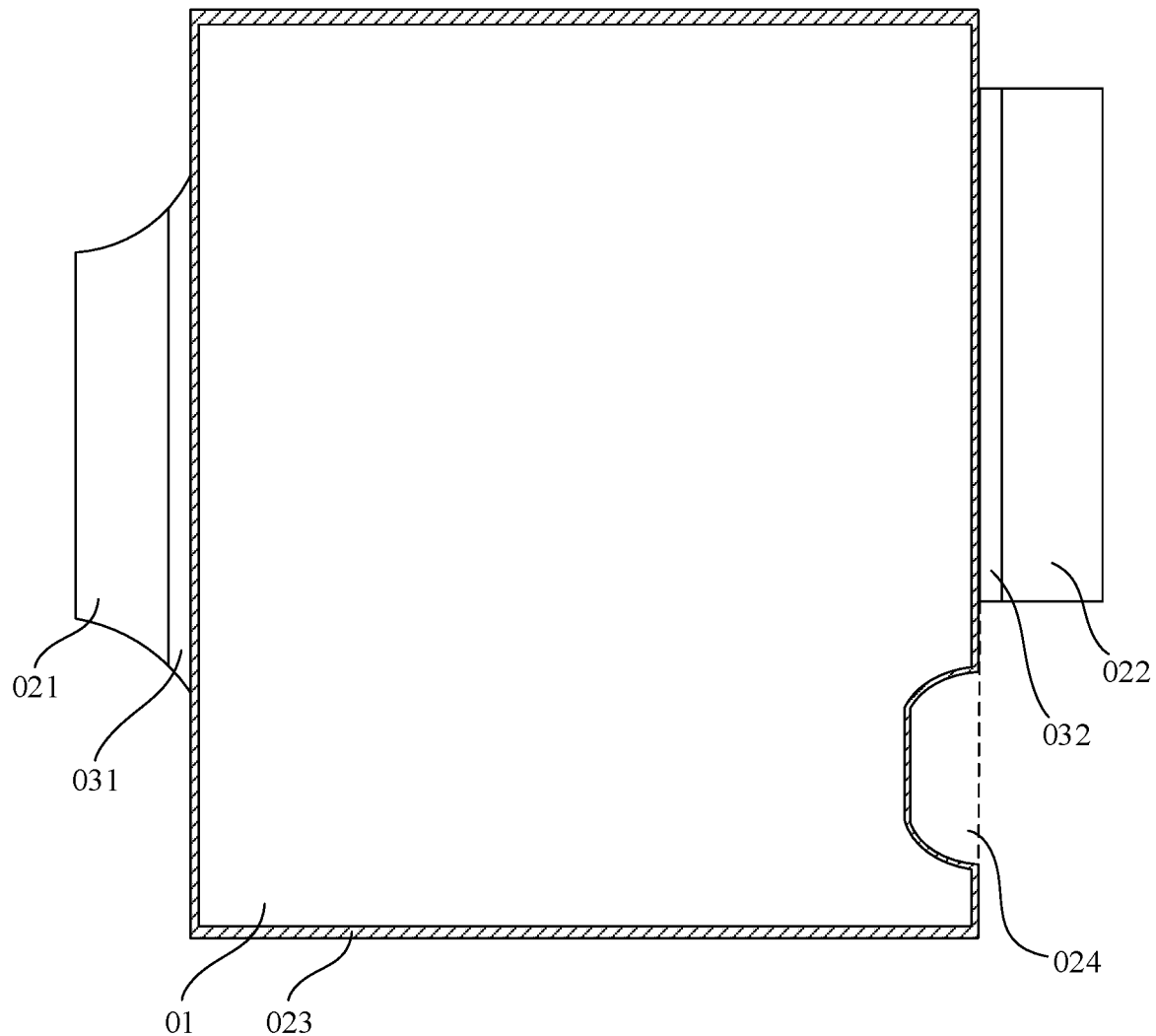
FIG. 15 is a structural schematic diagram of respective regions of the organic light-emitting display panel shown in FIG. 13.

FIG. 13 is a structural schematic diagram of an organic light-emitting display panel according to another embodiment of the present disclosure in an unfolded state, FIG. 14 is a structural schematic diagram of the organic light-emitting display panel shown in FIG. 13 in a bent state, and FIG. 15 is a structural schematic diagram of respective regions of the organic light-emitting display panel shown in FIG. 13. As shown in FIGS. 13 to 15, the light-transmitting sub-region 024 is located on a side of the second bending region 032 close to the display area 01, and the light-transmitting sub-region 024 and the display bonding region 022 are staggered in the extending direction of the second bending region 032.

As shown in FIG. 6, the organic light-emitting display panel has a bending axis 04 extending along a first direction h1. In a second direction h2, the touch bonding region 021 and the display bonding region 022 are located at the two opposite sides of the frame region 023, respectively. The second direction h2 is perpendicular to the first direction h1.

The organic light-emitting display panel is bendable along the bending axis 04. According to the embodiment of the present disclosure, the touch bonding region 021 and the display bonding region 022 may be provided to keep away from the bending axis 04, so as to be prevented from being bent, which would otherwise cause adverse effect on the bonding. In addition, the light-transmitting sub-region 024 may also keep away from the bending axis 04. Since the space for wirings between the light-transmitting sub-region 024 and the display area 01 is relatively compact, if the light-transmitting sub-region 024 is located at the bending axis 04, the metal wirings may be adversely affected due to the compact space, in one embodiment, the wirings may be broken.

As shown in FIGS. 3 to 6, the first touch metal layer 21 includes a bridge 211 located in the display area 01, and the second touch metal layer 22 includes a touch electrode 221 located the display area 01. At least a part of the touch electrode 221 is electrically connected to the bridge 211 via a first through-hole 201 in the touch insulation layer 20. The second touch metal layer 22 further includes a touch lead 05 extending from the frame region 023 to the touch bonding region 021. The touch electrode 221 is electrically connected to the touch connection pin 31 through the touch lead 05, and the touch connection pin 31 is located in the second touch metal layer 22.

In the structure shown in FIG. 4, the touch electrode 221, the touch lead 05, and the touch connection pin 31 are all formed by the second touch metal layer 22, and thus it is unnecessary to provide an additional through-hole above the first touch metal layer 21. This can avoid the problems in the related art, in which the touch electrode is connected to the driving device film layer and the bridge via through-holes having different depths, thereby alleviating the excessive etching caused by the through-holes of different depths above the touch metal layer and thus improving the touch performance.

Figure 16:
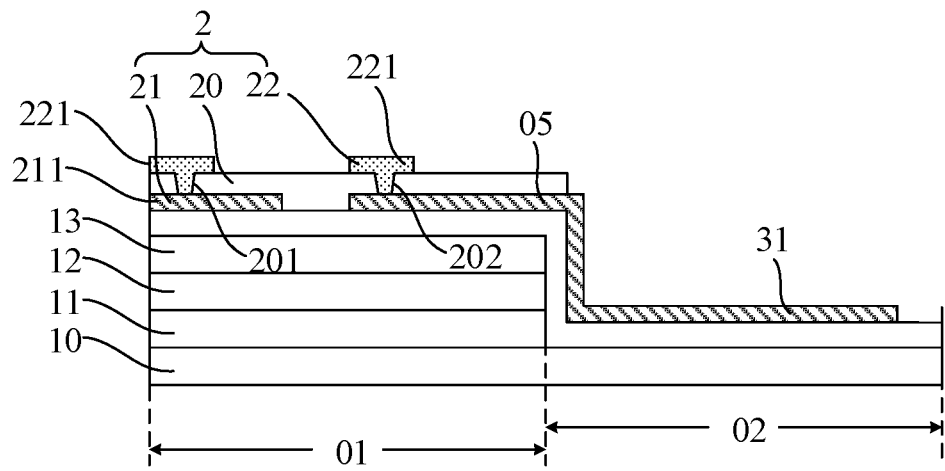
FIG. 16 is another cross-sectional view of the organic light-emitting display panel shown in FIG. 3 along BB' direction.

FIG. 16 is another cross-sectional view of the organic light-emitting display panel shown in FIG. 3 along BB' direction. As shown in FIG. 3, FIG. 16, FIG. 5 and FIG. 6, the first touch metal layer 21 includes a bridge 211 located in the display area 01, and the second touch metal layer 22 includes a touch electrode 221 located the display area 01. At least a part of the touch electrode 221 is electrically connected to the bridge 211 via a first through-hole 201 in the touch insulation layer 20. The first touch metal layer 21 further includes a touch lead 05 extending from the frame region 023 to the touch bonding region 021. The touch electrode 221 is electrically connected to the touch lead 05 via a second through-hole 202 in the touch insulation layer 20. The touch electrode 221 is electrically connected to the touch connection pin 31 through the touch lead 05, and the touch connection pin 31 is located in the first touch metal layer 21.

In the structure shown in FIG. 16, since the touch electrode 221 is located in the second touch metal layer 22, and the touch lead 05 and the touch connection pin 31 are located in the first touch metal layer 21, it is merely needed to provide a second through-hole 202 having the same depth as the first through-hole 201, instead of providing through-holes having different depths above the first touch metal layer 21. This can avoid the problems in the related art, in which the touch electrode is connected to the driving device film layer and the bridge via through-holes having different depths, thereby alleviating the excessive etching caused by the through-holes of different depths above the touch metal layer and thus improving the touch performance.

Figure 17:
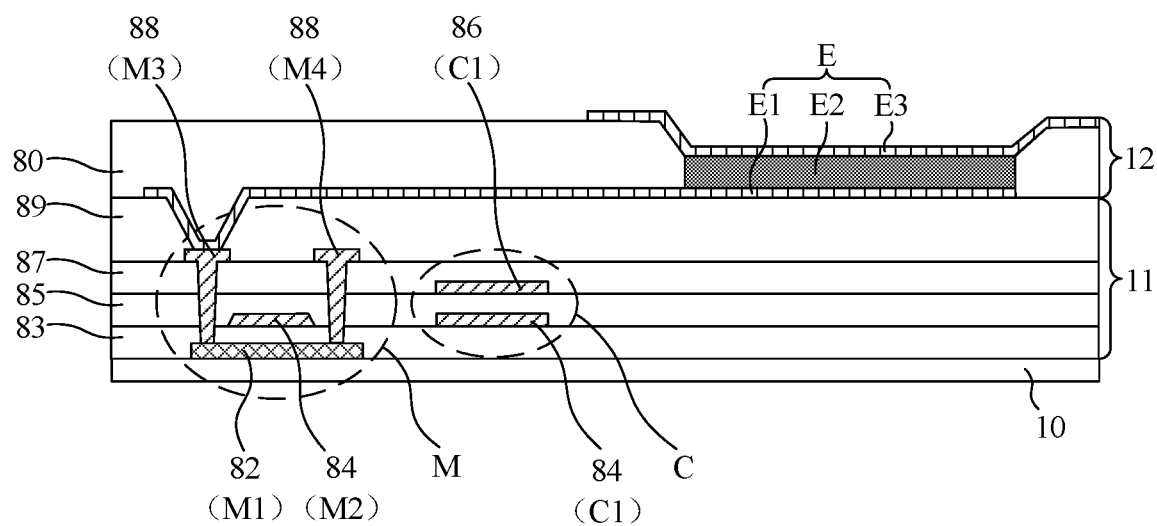
FIG. 17 is a cross-sectional view of a partial region of an organic light-emitting display panel according to an embodiment of the present disclosure.

FIG. 17 is a cross-sectional view of a partial region of an organic light-emitting display panel according to an embodiment of the present disclosure. As shown in FIG. 17, the driving device film layer 11 includes a gate metal layer 84, a semiconductor layer 82, and a source-drain metal layer 88. The above display connection pin is located in the source-drain metal layer 88.

The organic light-emitting display panel includes a display buffering layer 10, the semiconductor layer 82, a gate insulation layer 83, a gate metal layer 84, a first insulation interlayer 85, a capacitor metal layer 86, a second insulation interlayer 87, a source-drain metal layer 88, a planarization layer 89, and a pixel definition layer 80, which are sequentially stacked upwards in a direction perpendicular to a plane of the organic light-emitting display panel in the display region. The driving device film layer 11 includes the semiconductor layer 82, the gate insulation layer 83, the gate metal layer 84, the first insulation interlayer 85, the capacitor metal layer 86, the second insulation interlayer 87, the source-drain metal layer 88, and the planarization layer 89. The light-emitting device film layer 12 includes the pixel definition layer 80 and a light-emitting device E. The driving device film layer 11 further includes a thin film transistor M and a storage capacitor M. The thin film transistor M includes an active layer M1, a gate electrode M2, a source electrode M3 and a drain electrode M4. The active layer M1 is located in the semiconductor layer 82, and the gate electrode M2 is located in the gate metal layer 84. The source electrode M3 and the drain electrode M4 are located in the source-drain metal layer 88. The storage capacitor C includes a first electrode plate C1 and a second electrode plate C2. The first electrode plate C1 is located in the gate metal layer 84, and the second electrode plates C2 is located in the capacitor metal layer 86. The pixel definition layer 80 is provided with openings each corresponding to one light-emitting device E. The light-emitting device E includes an anode E1, an organic light-emitting layer E2 and a cathode E3 that are stacked. Under a voltage applied to the anode E1 and the cathode E3, holes and electrons are injected into the organic light-emitting layer E2 and recombined therein, so as to release energy to emit light. In the driving device film layer 11, the source-drain metal layer 88 has a relatively low resistivity, and thus it is more advantageous for transmission of electrical signals to form the display connection pin by the source-drain metal layer 88.

As an example, the first touch metal layer 21 may include a titanium metal layer, an aluminum metal layer and a titanium metal layer that are sequentially stacked. The second touch metal layer 22 may include a titanium metal layer, an aluminum metal layer, and a titanium metal layer that are sequentially stacked.

For the touch metal layer formed by the sequentially stacked titanium metal layer, aluminum metal layer and titanium metal layer, if through-holes having different depths are provided above the touch metal layer, the titanium metal layer may be excessively etched, and thus the exposed aluminum metal layer is more likely to be eroded in the subsequent processing, resulting in a poor contact with a upper touch metal layer during the electrical connection. Therefore, the structure in which the touch metal layer is formed by the sequentially stacked titanium metal layer, aluminum metal layer and titanium metal layer in accordance with the embodiments of the present disclosure, for preventing the aluminum metal layer from being eroded after the titanium metal layer is etched away.

Figure 18:
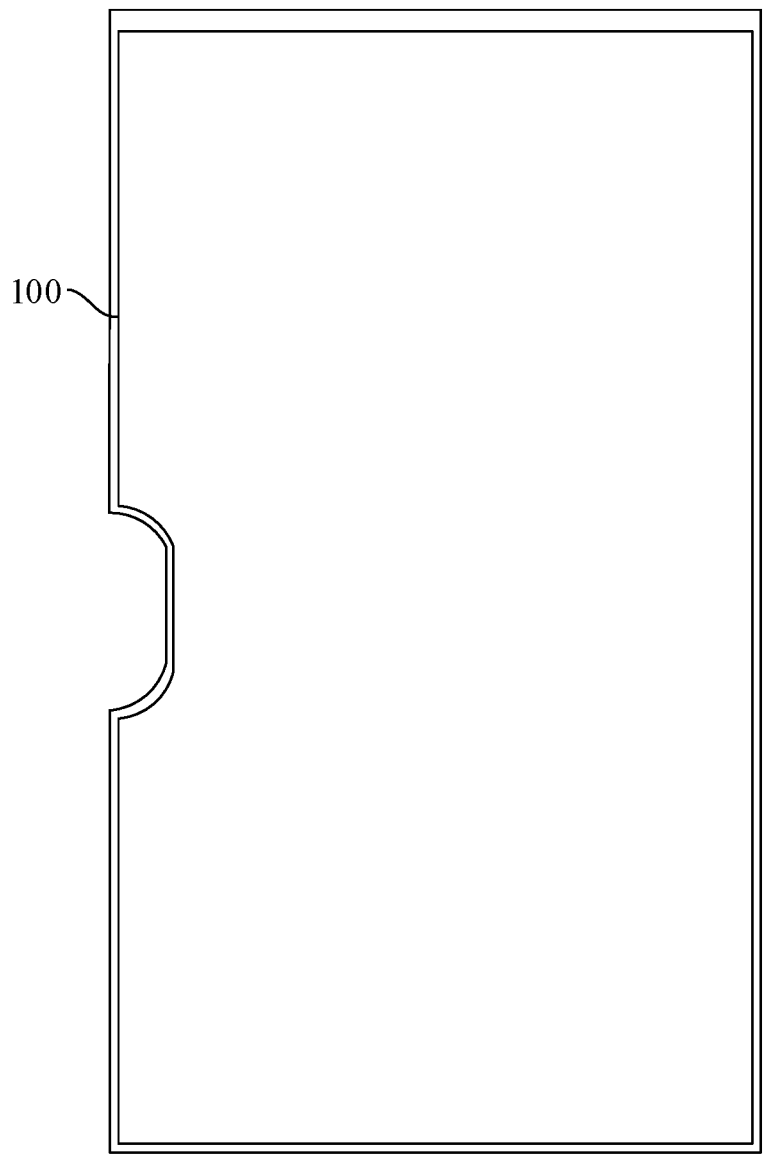
FIG. 18 is a schematic structural diagram of a display apparatus according to an embodiment of the present disclosure.

In another embodiment, the present disclosure provides a display apparatus. FIG. 18 is a schematic structural diagram of a display apparatus according to an embodiment of the present disclosure. As shown in FIG. 18, the display apparatus includes the display panel 100 described above.

The structure of the organic light-emitting display panel 100 is the same as that described in the above embodiments, which will not be repeated herein. The display apparatus can be any electronic apparatus having a display function such as a mobile phone, a tablet computer, a notebook computer, an electronic paper book, or a television.

In the display apparatus according to the embodiment of the present disclosure, as the touch bonding region and the display bonding region are respectively located on two opposite sides of the display area, the touch bonding region and the display bonding region, when being bonded, can be respectively bonded to the flexible circuit board or the driving chip in two separate bonding processes. In this way, the touch connection pin and the display connection pin can be fabricated with different metal layers, i.e., the display connection pin is located in the driving device film layer and the touch connection pin is located in the first touch metal layer or the second touch metal layer. This can avoid the problems in the related art, in which the touch electrode is connected to the driving device film layer and the bridge via through-holes having different depths, thereby alleviating the excessive etching caused by the through-holes of different depths above the touch metal layer and thus improving the touch performance.

The embodiments described above are embodiments of the present disclosure, but not intended to limit the present disclosure. Any modifications, equivalent substitutions, improvements, etc., which fall within the spirit and principles of the present disclosure, should be included in the protection scope of the present disclosure.

What is claimed is:

1. An organic light-emitting display panel, comprising:
a display buffering layer;
a driving device film layer;
a light-emitting device film layer;
an encapsulation film layer; and
a touch film layer,
wherein the driving device film layer, the light-emitting device film layer, the encapsulation film layer and the touch film layer are sequentially stacked,
the touch film layer comprises a first touch metal layer, a touch insulation layer and a second touch metal layer that are sequentially stacked, the first touch metal layer being located between the second touch metal layer and the encapsulation film layer,
the organic light-emitting display panel has a display area and a non-display area, the non-display area comprises a touch bonding region and a display bonding region, and the touch bonding region and the display bonding region are located on two opposite sides of the display area, respectively,
a touch connection pin is provided in the touch bonding region, a display connection pin is provided in the display bonding region, and the display connection pin is located in the driving device film layer,
the first touch metal layer comprises a bridge located in the display area, the second touch metal layer comprises a touch electrode located in the display area, and at least a part of the touch electrode is electrically connected to the bridge via a first through-hole in the touch insulation layer,
the second touch metal layer further comprises a touch lead extending from the frame region to the touch bonding region, the touch electrode is electrically connected to the touch connection pin through the touch lead, the touch connection pin is located in the second touch metal layer, and a width of the touch lead is smaller than a width of the touch connection pin, and
a projection of the touch connection pin on the display buffering layer is not overlap a projection of the touch lead on the display buffering layer.

2. The organic light-emitting display panel according to claim 1, wherein the non-display area further comprises a frame region surrounding the display area, and the touch bonding region and the display bonding region are located on two opposite sides of the frame region, respectively,
a stripe-shaped first bending region is provided between the touch bonding region and the frame region, such that a part of the organic light-emitting display panel in the touch bonding region is bendable to a back surface of the organic light-emitting display panel along an extending direction of the stripe-shaped first bending region, and
a stripe-shaped second bending region is provided between the display bonding region and the frame region, such that a part of the organic light-emitting display panel in the display bonding region is bendable to the back surface of the organic light-emitting display panel along an extending direction of the second bending region.

3. The organic light-emitting display panel according to claim 2, wherein the frame region comprises a light-transmitting sub-region, and
the light-transmitting sub-region is located on a side of the display area close to the first bending region.

4. The organic light-emitting display panel according to claim 3, wherein the light-transmitting sub-region is located between the first bending region and the display area, an edge of the light-transmitting sub-region facing away from the display area coincides with an edge of the first bending region close to the display area, and an edge of the light-transmitting sub-region close to the display area is spaced apart from the display area.

5. The organic light-emitting display panel according to claim 4, wherein at least a part of signal lines in the driving device film layer is located in the touch bonding region.

6. The organic light-emitting display panel according to claim 3, wherein the light-transmitting sub-region and the touch bonding region are staggered in the extending direction of the first bending region.

7. The organic light-emitting display panel according to claim 2, wherein the frame region comprises a light-transmitting sub-region, and
the light-transmitting sub-region is located on a side of the display area close to the second bending region.

8. The organic light-emitting display panel according to claim 7, wherein the light-transmitting sub-region is located between the second bending region and the display area, an edge of the light-transmitting sub-region facing away from the display area coincides with an edge of the second bending region close to the display area, and an edge of the light-transmitting sub-region close to the display area is spaced apart from the display area.

9. The organic light-emitting display panel according to claim 7, wherein the light-transmitting sub-region is located on a side of the display area close to the stripe-shaped second bending region, and the light-transmitting sub-region and the display bonding region are staggered in the extending direction of the second bending region.

10. The organic light-emitting display panel according to claim 2, wherein the organic light-emitting display panel has a bending axis extending along a first direction, and
in a second direction perpendicular to the first direction, the touch bonding region and the display bonding region are located on the two opposite sides of the frame region, respectively.

11. The organic light-emitting display panel according to claim 1, wherein the driving device film layer comprises a gate metal layer, a semiconductor layer and a source-drain metal layer, and
the display connection pin is located in the source-drain metal layer.

12. The organic light-emitting display panel according to claim 1, wherein the first touch metal layer comprises a titanium metal layer, an aluminum metal layer and a titanium metal layer that are sequentially stacked, and
the second touch metal layer comprises a titanium metal layer, an aluminum metal layer and a titanium metal layer that are sequentially stacked.

13. A display apparatus, comprising:
an organic light-emitting display panel, wherein the organic light-emitting display panel comprising:
a display buffering layer;
a driving device film layer;
a light-emitting device film layer;
an encapsulation film layer; and
a touch film layer,
wherein the display buffering layer, the driving device film layer, the light-emitting device film layer, the encapsulation film layer and the touch film layer are sequentially stacked,
the touch film layer comprises a first touch metal layer, a touch insulation layer and a second touch metal layer that are sequentially stacked, the first touch metal layer being located between the second touch metal layer and the encapsulation film layer,
the organic light-emitting display panel has a display area and a non-display area, the non-display area comprises a touch bonding region and a display bonding region, and the touch bonding region and the display bonding region are located on two opposite sides of the display area, respectively,
a touch connection pin is provided in the touch bonding region, and the touch connection pin is located in the first touch metal layer or the second touch metal layer,
a display connection pin is provided in the display bonding region, and the display connection pin is located in the driving device film layer,
the first touch metal layer comprises a bridge located in the display area, the second touch metal layer comprises a touch electrode located in the display area, and at least a part of the touch electrode is electrically connected to the bridge via a first through-hole in the touch insulation layer, and
the second touch metal layer further comprises a touch lead extending from the frame region to the touch bonding region, the touch electrode is electrically connected to the touch connection pin through the touch lead, the touch connection pin is located in the second touch metal layer, and a width of the touch lead is smaller than a width of the touch connection pin; or the first touch metal layer further comprises a touch lead extending from the frame region to the touch bonding region, the touch electrode is electrically connected to the touch lead via a second through-hole in the touch insulation layer, the touch electrode is electrically connected to the touch connection pin through the touch lead, the touch connection pin is located in the first touch metal layer, and a part of a surface of the touch connection pin facing away from the display buffering layer is uncovered by the touch insulation layer.

14. An organic light-emitting display panel, comprising:
a display buffering layer;
a driving device film layer;
a light-emitting device film layer;
an encapsulation film layer; and
a touch film layer,
wherein the display buffering layer, the driving device film layer, the light-emitting device film layer, the encapsulation film layer and the touch film layer are sequentially stacked,
the touch film layer comprises a first touch metal layer, a touch insulation layer and a second touch metal layer that are sequentially stacked, the first touch metal layer being located between the second touch metal layer and the encapsulation film layer,
the organic light-emitting display panel has a display area and a non-display area, the non-display area comprises a touch bonding region and a display bonding region, and the touch bonding region and the display bonding region are located on two opposite sides of the display area, respectively,
a touch connection pin is provided in the touch bonding region, and the touch connection pin is located in the first touch metal layer or the second touch metal layer,
a display connection pin is provided in the display bonding region, and the display connection pin is located in the driving device film layer,
the first touch metal layer comprises a bridge located in the display area, the second touch metal layer comprises a touch electrode located in the display area, and at least a part of the touch electrode is electrically connected to the bridge via a first through-hole in the touch insulation layer,
the first touch metal layer further comprises a touch lead extending from the frame region to the touch bonding region, the touch electrode is electrically connected to the touch lead via a second through-hole in the touch insulation layer, the touch electrode is electrically connected to the touch connection pin through the touch lead, and the touch connection pin is located in the first touch metal layer, and
a part of a surface of the touch connection pin facing away from the display buffering layer is uncovered by the touch insulation layer.

15. The organic light-emitting display panel according to claim 14, wherein the non-display area further comprises a frame region surrounding the display area, and the touch bonding region and the display bonding region are located on two opposite sides of the frame region, respectively,
a stripe-shaped first bending region is provided between the touch bonding region and the frame region, such that a part of the organic light-emitting display panel in the touch bonding region is bendable to a back surface of the organic light-emitting display panel along an extending direction of the stripe-shaped first bending region, and a stripe-shaped second bending region is provided between the display bonding region and the frame region, such that a part of the organic light-emitting display panel in the display bonding region is bendable to the back surface of the organic light-emitting display panel along an extending direction of the second bending region.

16. The organic light-emitting display panel according to claim 15, wherein the frame region comprises a light-transmitting sub-region, and the light-transmitting sub-region is located on a side of the display area close to the second bending region; and the light-transmitting sub-region is located between the second bending region and the display area, an edge of the light-transmitting sub-region facing away from the display area coincides with an edge of the second bending region close to the display area, and an edge of the light-transmitting sub-region close to the display area is spaced apart from the display area.

17. The organic light-emitting display panel according to claim 15, wherein the frame region comprises a light-transmitting sub-region, and the light-transmitting sub-region is located on a side of the display area close to the second bending region; and the light-transmitting sub-region is located on a side of the display area close to the stripe-shaped second bending region, and the light-transmitting sub-region and the display bonding region are staggered in the extending direction of the second bending region.

18. The organic light-emitting display panel according to claim 15, wherein the organic light-emitting display panel has a bending axis extending along a first direction, and in a second direction perpendicular to the first direction, the touch bonding region and the display bonding region are located on the two opposite sides of the frame region, respectively.

19. The organic light-emitting display panel according to claim 14, wherein the frame region comprises a light-transmitting sub-region, and the light-transmitting sub-region is located on a side of the display area close to the first bending region.

* * * * *